US012272423B2

(12) United States Patent
Upadhya et al.

(10) Patent No.: US 12,272,423 B2
(45) Date of Patent: Apr. 8, 2025

(54) METHODS OF OPERATING A NEAR MEMORY PROCESSING-DUAL IN-LINE MEMORY MODULE (NMP-DIMM) FOR PERFORMING A READ OPERATION AND AN ADAPTIVE LATENCY MODULE AND A SYSTEM THEREOF

(71) Applicant: SAMSUNG ELECTRONICS CO., LTD., Suwon-si (KR)

(72) Inventors: Sachin Suresh Upadhya, Bengaluru (IN); Eldho Pathiyakkara Thombra Mathew, Bengaluru (IN); Mayuresh Jyotindra Salelkar, Bengaluru (IN); Jinin So, Hwaseong-si (KR); Jonggeon Lee, Seoul (KR); Kyungsoo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 17/974,940

(22) Filed: Oct. 27, 2022

(65) Prior Publication Data
US 2023/0386534 A1    Nov. 30, 2023

(30) Foreign Application Priority Data

May 25, 2022    (IN) .............................. 202241029969

(51) Int. Cl.
*G11C 7/10* (2006.01)
*G11C 7/22* (2006.01)

(52) U.S. Cl.
CPC .......... *G11C 7/1069* (2013.01); *G11C 7/1063* (2013.01); *G11C 7/1066* (2013.01); *G11C 7/227* (2013.01)

(58) Field of Classification Search
CPC ... G11C 7/1069; G11C 7/1063; G11C 7/1066; G11C 7/227
See application file for complete search history.

(56) References Cited

U.S. PATENT DOCUMENTS 6,715,096 B2    3/2004  Kuge
7,751,261 B2    7/2010  Cho
(Continued)

FOREIGN PATENT DOCUMENTS

CN    104932989    9/2015
WO    2021-055624    3/2021

OTHER PUBLICATIONS

W. Sun, Z. Li, S. Yin, S. Wei and L. Liu, "ABC-DIMM: Alleviating the Bottleneck of Communication in DIMM-based Near-Memory Processing with Inter-DIMM Broadcast," 2021 ACM/IEEE 48th Annual International Symposium on Computer Architecture (ISCA), Valencia, Spain, 2021, pp. 237-250. (Year: 2021).*
(Continued)

*Primary Examiner* — Han Yang
(74) *Attorney, Agent, or Firm* — F. CHAU & ASSOCIATES, LLC

(57) ABSTRACT

A method of operating a Near Memory Processing-Dual In-line Memory (NMP-DIMM) system, the method including: determining, by an adaptive latency module of the NMP-DIMM system, a synchronized read latency value for performing a read operation upon receiving a Multi-Purpose Register (MPR) read instruction from a host device communicatively connected with the NMP-DIMM system, wherein the MPR read instruction is received from the host device for training the NMP-DIMM system, wherein the synchronized read latency value is determined based on one or more read latency values associated with one or more memory units of the NMP-DIMM system; and synchronizing, by the adaptive latency module, one or more first type
(Continued)

data paths and a second type data path in the NMP-DIMM system based on the determined synchronized read latency value.

14 Claims, 9 Drawing Sheets

(56) References Cited

U.S. PATENT DOCUMENTS

| | | | |
|---|---|---|---|
| 8,266,471 | B2 | 9/2012 | Sikdar |
| 8,760,946 | B2 | 6/2014 | Dearth et al. |
| 10,032,502 | B1 | 7/2018 | Gopalan et al. |
| 10,658,019 | B2 | 5/2020 | Kwak |
| 10,810,144 | B2 | 10/2020 | Lim et al. |
| 2004/0107326 | A1 | 6/2004 | Janzen et al. |
| 2008/0091906 | A1* | 4/2008 | Brittain ................ A61C 17/349 711/E12.001 |
| 2008/0256282 | A1* | 10/2008 | Guo .................... G06F 13/4239 710/305 |
| 2018/0107406 | A1 | 4/2018 | O et al. |
| 2019/0065107 | A1 | 2/2019 | Prather |
| 2019/0286586 | A1 | 9/2019 | Minopoli et al. |
| 2020/0387450 | A1 | 12/2020 | Lim |
| 2021/0081138 | A1 | 3/2021 | Park et al. |
| 2021/0349730 | A1 | 11/2021 | Lee et al. |

OTHER PUBLICATIONS

Extended European Search Report issued in EP Patent Application No. 23167032.4 on Oct. 13, 2023.
Jedec: "DDR3 SDRAM Standard", XP055139214, 2012.

* cited by examiner

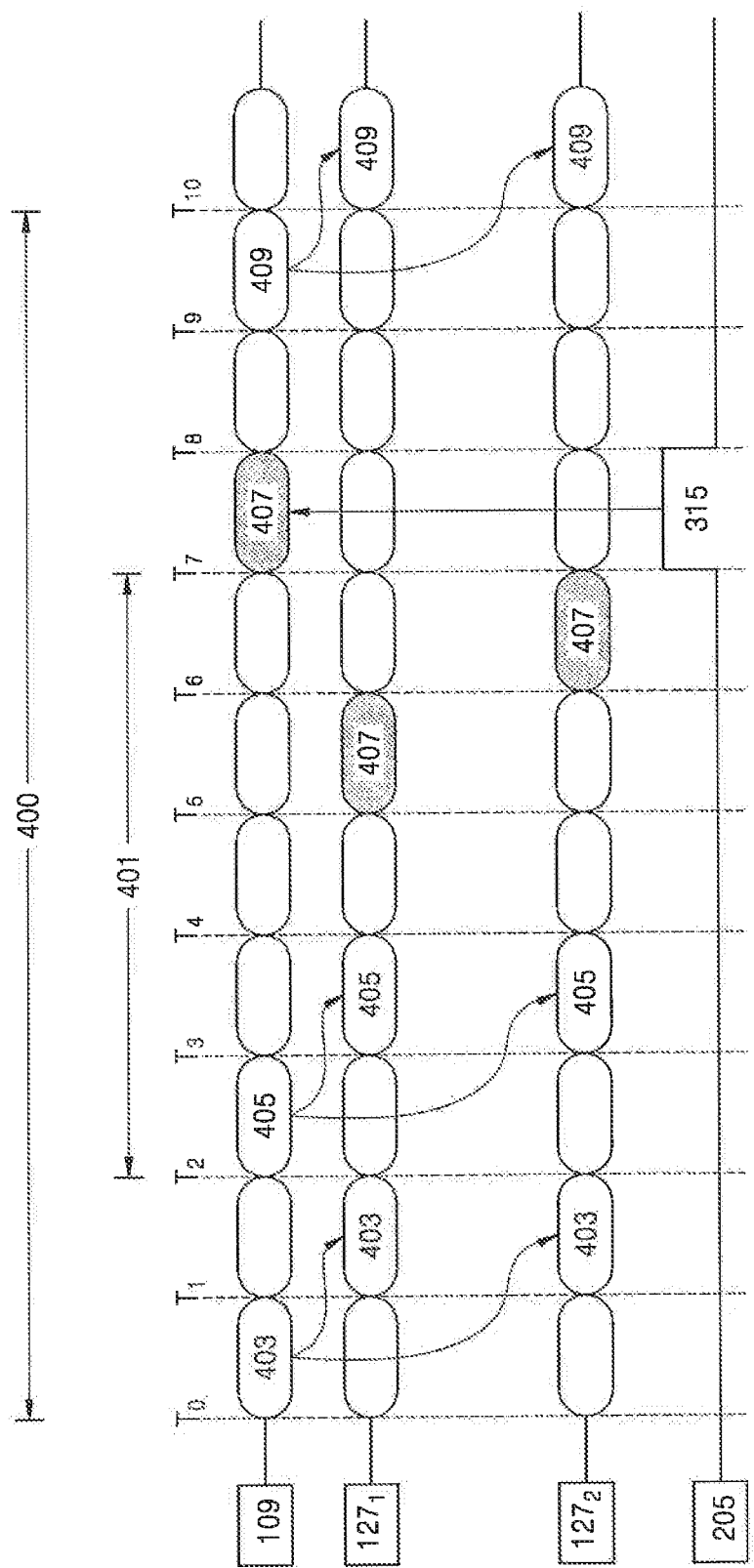

METHODS OF OPERATING A NEAR MEMORY PROCESSING-DUAL IN-LINE MEMORY MODULE (NMP-DIMM) FOR PERFORMING A READ OPERATION AND AN ADAPTIVE LATENCY MODULE AND A SYSTEM THEREOF

CROSS-REFERENCE TO RELATED APPLICATION

This application claims priority under 35 U.S.C. § 119 to Indian Patent Application No. 202241029969 filed on May 25, 2022, the disclosure of which is incorporated by reference herein in its entirety.

TECHNICAL FIELD

The present disclosure relates in general to memory systems, and more particularly, methods of operating a Near Memory Processing-Dual In-line Memory Module (NMP-DIMM) system for performing a read operation and an adaptive latency module and a system thereof.

DISCUSSION OF RELATED ART

A Near Memory Processing-Dual In-line Memory Module (NMP-DIMM) system integrates accelerators within a buffer chip to provide high performance with relatively low design and manufacturing costs. The NMP-DIMM system enables a host device to perform data processing associated with data-intensive applications without requiring data movement from one or more Dynamic Random Access Memories (DRAMs) of the NMP-DIMM system to a local cache memory of the host device. This significantly reduces cost associated with data movement.

In general, the host device accesses the one or more DRAMs and a configuration space of the NMP-DIMM system through a DIMM interface. The NW-DIMM system enables the host device to load a data set or a working set on the one or more DRAMs. Further, the NMP-DIMM system enables the host device to configure a processing module of the NMP-DIMM system by accessing the configuration space of the NMP-DIMM system. However, in some scenarios, a read latency associated with the configuration space of the NMP-DIMM system is different from read latencies associated with the one or more DRAMs (alternatively referred as DRAM read latency). In the aforesaid scenarios, the data received at the host device may get corrupted or lost, if the host device cannot determine read latencies of each path associated with data retrieval. Moreover, in some scenarios, the read latencies associated with the one or more DRAMs may change tier every power cycle. In addition, in some scenarios, the read latencies may change from one NMP board to another NMP board due to interface level differences. Due to such variation in the read latencies, the host device may not be able to perform a read operation in a deterministic manner.

Accordingly, the DRAM latency value is determined by simulation or hardware validation. Further, a counter is utilized whose maximum value is hardcoded to the determined DRAM latency value. In this case, for every read instruction issued by the host device for the configuration space of the NMP-DIMM system, the counter performs a counting until the maximum value is achieved. Upon counting the maximum value, data read from the configuration space of the NMP-DIMM system is sent to the host device. However, in the NMP-DIMM system, a memory physical layer (PHY), which is communicatively connected with the DRAM, operates at a lower frequency than that of the DRAM. Due to this, the DRAM read latency seen by the memory PITY changes by one or two cycles for every power cycle. Further, the DRAM read latency may vary from one NMP-DIMM board to another NMP-DIMM board due to manufacturing differences. Due to the aforesaid issues, hardcoding the latency value does necessarily not ensure that data integrity is preserved when accessing the configuration space of the NMP-DIMM system and the DRAMs by the host device.

SUMMARY

In an embodiment, the present disclosure provides a method of operating a Near Memory Processing-Dual In-line Memory (NMP-DIMM) system, the method including: determining, by an adaptive latency module of the NMP-DIMM system, a synchronized read latency value for performing a read operation upon receiving a Multi-Purpose Register (MPR) read instruction from a host device communicatively connected with the NMP-DIMM system, wherein the MPR read instruction is received from the host device for training the NMP-DIMM system, wherein the synchronized read latency value is determined based on one or more read latency, values associated with one or more memory units of the NMP-DIMM system; and synchronizing, by the adaptive latency module, one or more first type data paths and a second type data path in the NMP-Dill system based on the determined synchronized read latency value.

In an embodiment, the present disclosure provides an adaptive latency module configured in an NMP-DIMM system, the adaptive latency module including: a command detector configured to: detect an MPR read instruction from a host device communicatively connected with the NMP-DIMM system, wherein the MPR read instruction is received from the host device for training the NMP-DIMM system; a latency detector communicatively connected with the command detector, wherein the latency detector is configured to: determine a synchronized read latency value for performing the read operation upon receiving the MPR read instruction, wherein the synchronized read latency value is determined based on one or more read latency values associated with one or more memory units of the NMP-DIMM system; one or more first latency handlers communicatively connected with the latency detector and the one or more memory units, wherein the one or more first latency handlers are configured to: synchronize one or more first type data paths in the NMP-DIMM system based on the determined synchronized read latency value; and a second latency handler communicatively connected with the latency detector and a configuration space of the NMP-DIMM system, wherein the second latency handler is configured to: synchronize a second type data path in the NMP-DIMM system based on the determined synchronized read latency value.

In an embodiment, the present disclosure provides a method of operating an NMP-DIMM system, the method including: extracting, by the NMP-DIMM system, a synchronized read latency value, and data from one or more memory units of the NMP-DIMM system, and performing, by the NMP-DIMM system, a read operation, upon receiving a data read instruction from a host device communicatively connected with the NMP-DIMM system; and sending, by the NMP-DIMM system, the data extracted from the one or more memory units to the host device through one or more data paths in the NMP-DIMM system, wherein the one or more data paths are synchronized based on the extracted synchronized read latency value.

In an embodiment, the present disclosure provides an NMP-DIMM system, the system including: an adaptive latency module; one or more memory units configured to store data; one or more memory physical layers (PH s) communicatively connected between the adaptive latency module and the one or more memory units, wherein the one or more memory PHYs are configured to: receive a data read instruction from a host device communicatively connected with the NMP-DIMM system; extract the data from the respective one or more memory units based on the data read instruction; send the extracted data to the host device via a respective one or more latency handlers, wherein each of the one or more latency handlers is associated with a memory unit of the one or more memory units; and a configuration space communicatively connected with the adaptive latency module, wherein the configuration space configures an accelerator of the NMP-DIMM system, and stores results and status of the accelerator.

BRIEF DESCRIPTION OF THE ACCOMPANYING DRAWINGS

The accompanying drawings, which are incorporated in and constitute a part of this disclosure, illustrate embodiments of the present disclosure and together with the description, serve to explain the disclosed principles. The same numbers are used throughout the figures to reference like features and components. Some devices and/or methods in accordance with embodiments of the present subject matter are now described below, by way of example, with reference to the accompanying figures, FIG. 1 shows an example architecture for operating a Near Memory Processing-Dual In-line Memory (NMP-DIMM) system for performing a read operation in accordance with some embodiments of the present disclosure.

FIGS. 4a-4b show timing diagrams illustrating a Multi-Purpose Register (MPR) training by a host device in accordance with some embodiments of the present disclosure.

Figure 1:
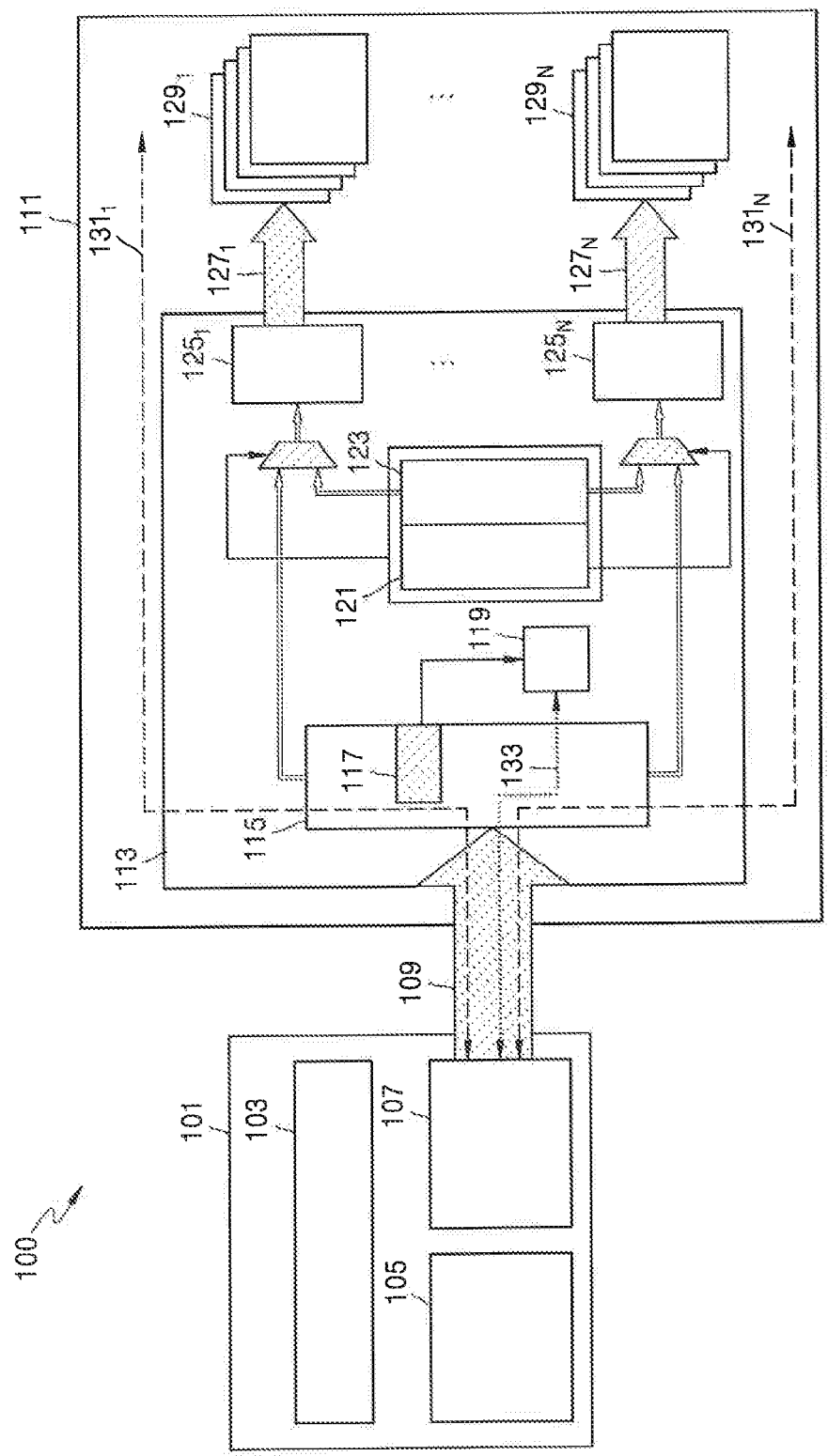

It should be appreciated by those skilled in the art that any block diagrams herein represent views of illustrative systems embodying the principles of the present subject matter. Similarly, it will be appreciated that any flowcharts, flow diagrams, state transition diagrams, pseudo code, and the like, represent various processes which may be represented in a computer readable medium and executed by a computer or processor.

DETAILED DESCRIPTION OF THE EMBODIMENTS

While the disclosure is susceptible to various modifications and alternative forms, specific embodiments thereof are shown by way of example in the drawings and will be described in detail below. It should be understood, however that this is not intended to limit the disclosure to the particular forms disclosed, but on the contrary, the disclosure is to cover all modifications, equivalents, and alternatives falling within the scope of the disclosure.

The terms "comprises", "comprising", or any other variations thereof, may cover a non-exclusive inclusion, such that a setup, device or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

Embodiments of the present disclosure relate to methods of operating a Near Memory Processing-Dual In-line Memory (NMP-DIMM) system for performing a read operation, an adaptive latency module and the NMP-DIMM system. The present disclosure synchronizes read latencies associated with multiple data paths of the NMP-DIMM system to reduce data loss and maintain data integrity during a read operation performed by a host device, which is communicatively connected with the NMP-DIMM system. For example, in the NMP-DIMM system, the multiple data paths include memory unit data paths and a configuration space data path. The present disclosure adaptively determines a synchronized read latency value based on individual read latency values associated with the memory unit data paths during every power boot up process and synchronizes the memory unit data paths and a configuration space data path based on the synchronized read latency value. The present disclosure performs the synchronization to make read latencies of the memory unit data paths and the configuration space data path equal. Consequently, this enables the host device to access the memory unit data paths and the configuration space data path in a deterministic manner.

FIG. 1 shows an example architecture for operating an NMP-DIMM system for performing a read operation in accordance with some embodiments of the present disclosure.

As shown in FIG. 1, the architecture 100 may include a host device 101, and an NMP-DIMM system 111. The host device 101 may be communicatively coupled to the NMP-DIMM system 111 through a DIMM interface 109. As an example, the host device 101 may include, but is not limited to, a desktop computer, a laptop, a printer, and a server. The host device 101 may comprise a Central Processing Unit (CPU) 103, a Memory Management Unit (MMU) 105, and a memory controller 107. The CPU 103 (also, referred as a processor) may execute instructions, and performs arithmetic, logic, controlling, and input/output (I/O) operations specified by the instructions. Further, the MMU 105 may perform translation of virtual memory addresses to physical addresses. The memory controller 107 may control the flow of data between the CPU 103 and one or more memory units 129 of the NMP-DIMM system 111. The memory controller 107 may enable the CPU 103 to perform read and write operations using the one or more memory units 129 of the NMP-DIMM system 111. Further, the memory controller 107 may perform refresh and calibration operations.

Further, the NMP-DIMM system 111 may comprise a buffer chip 113 and the one or more memory units $129_1$, . . . $129_N$ (collectively referred as one or more memory units 129). The one or more memory units 129 may store data. Each of the one or more memory units 129 may be a Dynamic Random Access Memory (DRAM). Further, the buffer chip 113 may comprise a host physical layer (PHY) 115, an adaptive latency module 117, one or more memory PHYs $125_1$, $125_N$ (collectively referred as one or more memory PHYs 125) associated with the one or more memory units 129, a configuration space 119, a processing module 121, and a memory controller 123. The host PHY 115 may receive one or more instructions from the host device 101 through the DIMM interface 109 for performing read and write operations. Further, the host PHY 115 may send the received one or more instructions to one of the adaptive latency module 117, and the one or more memory PHYs 125. As an example, if a Multi-Purpose Register (MPR) read instruction is received from the host device 101 for training the NMP-DIMM system 111, the host PHY 115 may send the MPR read instruction to the adaptive latency module 117. If a data read instruction for the configuration space 119 is received from the host device 101, the host PHY 115 may send the data read instruction to the adaptive latency module 117. If a data read instruction for a memory unit of the one or more memory units 129 is received from the host device 101, the host PHY 115 may send the data read instruction to the appropriate memory unit. Further, in response to the instruction sent, the host PHY 115 may receive data to be sent to the host device 101 from the adaptive latency module 117. As an example, the host PHY 115 may receive data read from the one or more memory units 129 and the data read from the configuration space 119, from the adaptive latency module 117. In addition, the host PHY 115 may receive a read enable signal from the adaptive latency module 117 to detect a time instant to send the data to the host device 101.

In an embodiment of the present disclosure, the adaptive latency module 117 may receive one of, the MPR read instruction and the data read instruction for the configuration space 119 from the host PIN 115. In response to the MPR read instruction, the adaptive latency module 117 may determine a synchronized read latency value for performing the read operation. The adaptive latency module 117 may determine the synchronized read latency value based on one or more read latency values associated with the one or more memory units 129. Based on the determined synchronized read latency value, the adaptive latency module 117 may synchronize one or more first type data paths $131_1$, . . . $131_N$ (collectively referred as one or more first type data paths 131) associated with the one or more memory units 129 and a second type data path 133 associated with the configuration space 119 in the NMP-DIMM system 111.

In an embodiment of the present disclosure, the one or more memory PHYs 125 may, be communicatively connected between the adaptive latency module 117, and the one or more memory units 129. Further, the one or more memory PHYs 125 may send instructions and receive data from the one or more memory units 129 through one or more memory interfaces $127_1$-$127_N$ (collectively referred as one or more memory interfaces 127). The one or more memory PHYs 125 may receive the data read instructions for the one or more memory units 129 from the host PHY 115. Based on the data read instruction, the one or more memory PHYs 125 may receive the data from the respective one or more memory units 129. Thereafter, the one or more memory PHYs 125 may send the data to the adaptive latency module 117 for introducing path delays in the one or more first type data paths 131 to achieve synchronization.

In an embodiment of the present disclosure, the configuration space 119 may be communicatively connected with the adaptive latency module 117. The configuration space 119 may configure an accelerator of the NMP-DIMM system 111. In addition, the configuration space 119 may store results and status of the accelerator. In addition, the configuration space 119 may receive the data read instruction from the adaptive latency module 117. In response to the data read instruction, the configuration space 119 may send the data to the adaptive latency module 117 for sending the data to the host device 101 in a deterministic manner.

In the NMP-DIMM system 111, the processing module 121 may fetch NMP commands from a buffer. The processing module 121 may parse the NMP commands and execute the NMP commands. The processing module 121 may indicate the CPU 103 of the host device 101 about the completion of an operation through a status register present in the configuration space 119. Further, the memory controller 123 may control the flow of data between the processing module 121 and the one or more memory units 129 through the respective one or more memory PHYs 125. The arrangement of various components making up the NMP-DIMM system illustrated in FIG. 1 are for explanation, not for limitation. Various embodiments of the present disclosure may be implemented on a variety of hardware platforms in addition to those illustrated in FIG. 1.

In FIG. 1, signals output from the host PIN 115 and the memory controller 123 may be input to a multiplexer prior to being selected based on a signal output from the processing module 121 for input to the one or more memory PHYs 125.

Figure 2:
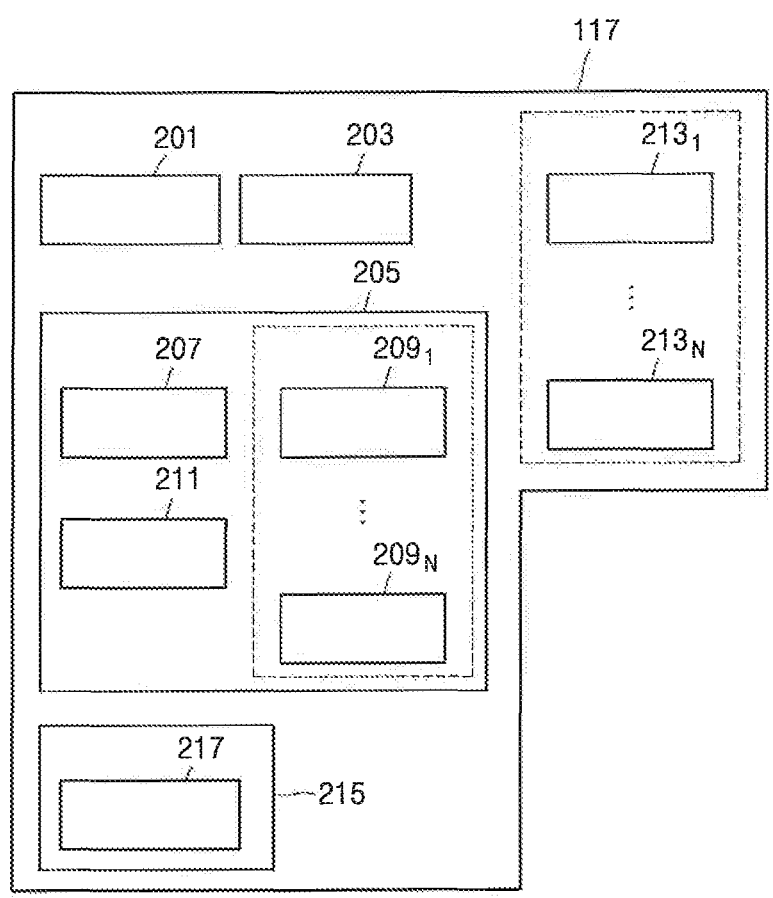
FIG. 2 shows a block diagram of an adaptive latency module in accordance with some embodiments of the present disclosure.

FIG. 2 shows a block diagram of an adaptive latency module in accordance with some embodiments of the present disclosure.

In some embodiments, the adaptive latency module 117 may include a command detector 201, a dummy read initiator 203, a latency detector 205, one or more first latency handlers $213_1$, . . . $213_N$ (collectively referred as one or more first latency handlers 213) and a second latency handler 215, as shown in FIG. 2. The command detector 201, the latency detector 205, the one or more first latency handlers 213 and the second latency handler 215 may be communicatively connected with the host PIN 115 of the NMP DIMM system 111. Further, the dummy read initiator 203 may be communicatively connected with the command detector 201. The latency detector 205 may be communicatively connected with the dummy read initiator 203. Further, the one or more first latency handlers 213 may be communicatively connected with the latency detector 205 and the one or more memory units 129 of the NMP-DIMM system 111. The second latency handler 215 may be communicatively connected with the command detector 201, the latency detector 205 and the configuration space 119 of the NMP-DIMM system 111.

In an embodiment of the present disclosure, the command detector 201 may receive one of an MPR read instruction and a data read instruction from the host PIN 115, which may be communicatively coupled with the host device 101 via the DIMM interface 109. The command detector 201 may receive the MPR read instruction for training the NMP-DIMM system 111. Upon receiving the MPR read instruction, the command detector 201 may generate an MPR training signal. Further, the command detector 201 may send the generated MPR training signal to the dummy read initiator 203 for initiating the dummy read operation. Further, the command detector 201 may receive the data read instruction for reading data from the configuration space 119 of the NMP-DIMM system 111. Upon receiving the data read instruction, the command detector 201 may generate an activation signal to trigger the second latency handler 215.

In an embodiment of the present disclosure, the dummy read initiator 203 may receive the MPR training signal from the command detector 201 for initiating the dummy read operation. Upon receiving the MPR training signal, the dummy read initiator 203 may send a dummy read instruction to each of the one or more memory PHYs 125 associated with the one or more memory units 129. The dummy read initiator 203 may send the dummy read instruction for executing the dummy read operation on each of the one or more memory units 129. The dummy read instruction may be one of an MPR read command and a DRAM read command. Additionally, the dummy read initiator 203 may generate a dummy read trigger signal upon sending the dummy read instruction to each of the one or more memory PHYs 125. The dummy read initiator 203 may send the dummy read trigger signal to the latency detector 205.

In an embodiment of the present disclosure, the latency detector 205 may determine a synchronized read latency value for performing the read operation upon receiving the dummy read instruction from the dummy read initiator 203. The latency detector 205 may determine the synchronized read latency value based on one or more read latency values associated with the one or more memory units 129 of the NMP-DIMM system 111. The latency detector 205 may comprise a first counter 207, one or more registers $209_1, \ldots 209_N$ (collectively referred as one or more registers 209) each associated with one of the one or more first type data paths 131, and a latency register 211.

Particularly, in the latency detector 205, the first counter 207 may be triggered to initiate counting upon receiving the dummy read instruction. Further, the first counter 207 may determine one or more time-durations associated with receiving the dummy read data from each of the one or more memory units 129. Here, the first counter 207 may detect one or more time instants, at which dummy read data is received from the one or more memory PHYs 125 in response to the dummy read instruction. Based on the detected time instants, the first counter 207 may determine the one or more time-durations. Further, the first counter 207 may measure the one or more read latency values associated with the one or more first type data paths 131 based on the determined one or more time-durations. The one or more first type data paths 131 may be associated with extracting data from the one or more memory units 129 of the NMP-DIMM system 111. Further, the first counter 207 may store the measured one or more read latency values in respective one or more registers 209. Thereafter, the latency detector 205 may determine a maximum read latency value among the measured one or more read latency values as the synchronized read latency value. Additionally, the latency detector 205 may store the synchronized read latency value in the latency register 211. Here, the synchronized read latency value may represent a system delay observed for all read accesses by the host device 101. Further, the latency detector 205 may send the synchronized read latency value and the one or more read latency values to the respective one or more first latency handlers 213 for introducing a path delay in each of the one or more first type data paths 131. In addition, the latency detector 205 may send a read enable signal to the host PHY 115. The read enable signal may be sent corresponding to last read data received amongst the one or more first type of data paths 131. The read enable signal may be utilized by the host PHY 115 to send the MPR read data to the host device 101.

In an embodiment of the present disclosure, the one or more first latency handlers 213 may synchronize one or more first type data paths 131 in the NMP-DIMM system 111 based on the determined synchronized read latency value. Particularly, each of the one or more first latency handlers 213 may determine an offset value for a respective first type data path. Each of the one or more first latency handlers 213 may determine the offset value based on a difference between the synchronized read latency value and the respective read latency value among the one or more read latency values. Based on the determined offset value, each of the one or more first latency handlers 213 may introduce a path delay in the respective first type data path. Here, the one or more first latency handlers 213 may add a required number of cycles in the respective one or more first type data paths 131 based on the determined offset values for introducing the path delays. The one or more first latency handlers 213 may utilize flip-flop based delay circuits for introducing the path delays in the respective one or more first type data paths 131. Further, the one or more first latency handlers 213 may send data, received from the respective one or more memory units 129 to the host device 101 via the host PHY 115 based on the respective introduced path delays. In this manner, the one or more first latency handlers 213 may ensure that latencies associated with the one or more first type data paths 131 are equal and deterministic.

In an embodiment of the present disclosure, the second latency handler 215 may synchronize a second type data path 133 in the NMP-DIMM system 111 based on the determined synchronized read latency value. The second type data path 133 may be associated with extracting data from the configuration space 119. The second latency handler 215 may comprise a second counter 217 for synchronizing the second type data path 133 based on the synchronized read latency value. Particularly, the second latency handler 215 may receive the activation signal from the command detector 201 to trigger the second counter 217. Further, the second latency handler 215 may retrieve the synchronized read latency value from the latency register 211 of the latency detector 205. The second counter 217 may stop upon expiry of a time duration equal to the synchronized read latency value. The second latency handler 215 may also receive data from the configuration space 119. The second latency handler 215 may send data read from the configuration space 119 to the host device 101 when the second counter 217 is stopped. In this manner, the second latency handler 215 may delay sending of the data read from the configuration space 119 based on the synchronized read latency value. The second latency handler 215 may ensure that the latency associated with the second type data path 133 is deterministic.

Figure 3A:
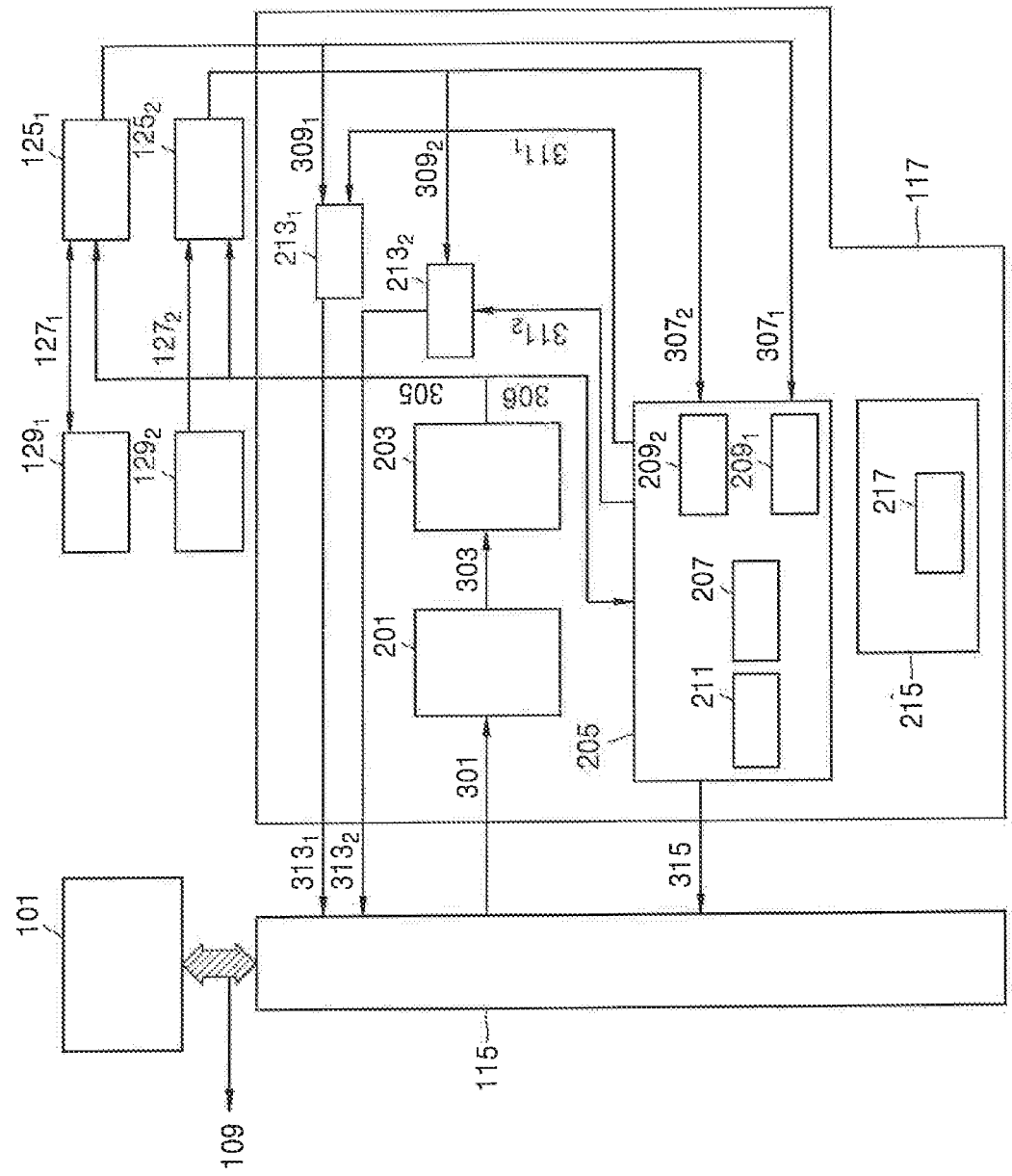
FIG. 3a shows an example scenario illustrating interactions of NMP-DIMM system components for determining a synchronized read latency value and synchronizing first type data paths associated with two memory units in accordance with some embodiments of the present disclosure.

FIG. 3a shows an example scenario illustrating interactions of NMP-DIMM system components for determining a synchronized read latency value and synchronizing first type data paths associated with two memory units in accordance with some embodiments of the present disclosure.

As illustrated in FIG. 3a, a first memory unit $129_1$ and a second memory unit $129_2$ may be configured in the NMP- DIMM system 111 to store the data. Each of the first memory unit 129₁ and the second memory unit 129₂ may be a DRAM. The first memory unit 129₁ and the second memory unit 129₂ may be communicatively connected with a first memory PRY 125₁ and a second memory PRY 125₂ through a first memory interface 127₁ and a second memory interface 127₂, respectively. Both the first memory PRY 125₁ and the second memory PITY 125₂ may be communicatively coupled with the adaptive latency module 117 of the NMP-DIMM system 111. For example, the first memory PRY 125₁ and the second memory PRY 125₂ may be connected to a latency detector 205 of the adaptive latency module 117. To perform a read operation without data loss, a host device 101 may send an MPR read instruction 301 to the NMP-DIMM system 111 through the DIMM interface 109 at every power boot up.

The host PHY 115 of the NMP-DIMM system 111 may receive the MPR read instruction 301 through the DIMM interface 109. The host PRY 115 may send the MPR read instruction 301 to a command detector 201 of the adaptive latency module 117. Upon receiving the MPR read instruction 301, the command detector 201 may send an MPR training signal 303 to a dummy read initiator 203 of the adaptive latency module 117. Upon receiving the MPR training signal 303, the dummy read initiator 203 may send a dummy read instruction 305 to each of the first memory PRY 125₁ and the second memory PRY 125₂. In addition, the dummy read initiator 203 may send a dummy read trigger signal 306 to a latency detector 205 of the adaptive latency module 117, as illustrated in FIG. 3a.

Upon receiving the dummy read trigger signal 306, a first counter 207 may be triggered in the latency detector 205. The first counter 207 may be associated with a first register 209₁ and a second register 209₂ of the latency detector 205. The first register 209₁ and the second register 209₂ may be communicatively connected with the first memory PRY 125₁ and the second memory PITY 125₂, respectively. The triggered first counter 207 may count read latency values associated with the first memory unit 129₁ and the second memory unit 129₂.

In response to receiving the dummy read instruction 305, the first memory PITY 125₁ may retrieve dummy read data 307₁ from the first memory unit 129₁. The dummy read data 307₁ may be received at t₁ time instant. Upon receiving the dummy read data 307₁ from the first memory PRY 125₁, the first counter 207 may determine a read latency value corresponding to the t₁ time instant as 15 nanoseconds (ns), for example. The read latency value of 15 ns may be stored in the first register 209₁. Further, the second memory PRY 125₂, upon receiving the dummy read instruction 305, may retrieve dummy read data 307₂ from the second memory unit 129₂. The dummy read data 307₂ may be received at t₂ time instant. Upon receiving the dummy read data 307₂ from the second memory PRY 125₂, the first counter 207 may determine a read latency value corresponding to the t₂ time instant as 20 ns, for example. The read latency value of 20 ns may be stored in the second register 209₂. Further, the latency detector 205 may determine 20 ns as the synchronized latency value, which is maximum value among the two read latency values 15 ns and 20 ns. The latency detector 205 may store 20 ns in a latency register 211. In other words, the synchronized latency value may be stored in the latency register 211.

Further, the latency detector 205 may send the synchronized latency value of 20 ns and the read latency value 311₁ of 15 ns to a first latency handler 213₁ associated with the first register 209₁. Further, the first latency handler 213₁ associated with the first register 209₁ may determine an offset value of 5 ns to be introduced in the first type data path associated with the first memory unit 129₁ to synchronize the corresponding read latency value with 20 ns. When the first latency handler 213₁ receives data 309₁ from the first memory PHY 125₁, the path delay of 5 ns may be introduced in the first type data path associated with the first memory unit 129₁. In a similar manner, the latency detector 205 may send the synchronized latency value of 20 ns and the read latency value 311₂ of 20 ns to a first latency handler 213₂ associated with the second register 209₂. The first latency handler 213₂ associated with the second register 209₂ may determine an offset value of 0 us to be introduced in the first type data path associated with the second memory unit 129₂. In this case, the first latency handler 213₂ may introduce the path delay of 0 ns in the first type data path associated with the second memory unit 129₂ upon receiving data 309₂ from the second memory PITY 125₂. In this manner, the first latency handlers 213₁, 213₂ synchronize the first type data paths 131 associated with the first memory unit 129₁ and the second memory unit 129₂ for sending delayed data 313₁, 313₂ to the host device 101. This ensures that a synchronized latency of 20 us is exhibited to the host device 101 while sending the delayed data 313₁, 313₂.

Additionally, the latency detector 205 may generate a read enable signal 315 upon receiving the data from both the first memory unit 129₁ and the second memory unit 129₂, and send the read enable signal 315 to the host PITY 115 for sending the data to the host device 101. Here, due to synchronization, the host device 101 may receive the data read from the first memory unit 129₁ and the second memory unit 129₂ simultaneously at same time instant irrespective of different individual latency values associated with the first type data paths 131, thereby preserving data integrity.

Figure 3B:
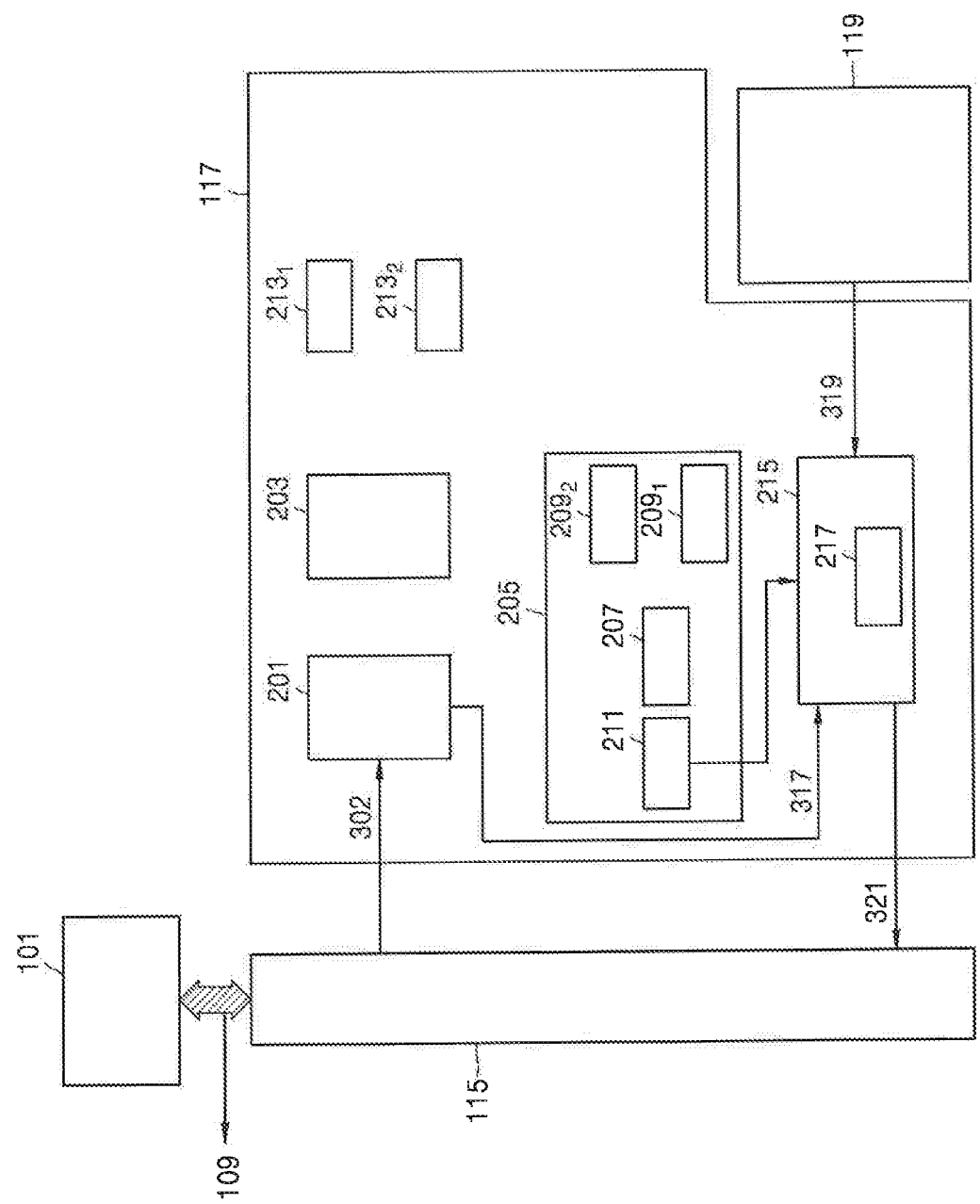
FIG. 3b shows an example scenario illustrating interactions of NMP-DIMM system components with a host device for synchronizing a second type data path in the NMP-DIMM system in accordance with some embodiments of the present disclosure.

FIG. 3b shows an example scenario illustrating interactions of NMP-DIMM system components for synchronizing a second type data path in the NMP-DIMM system in accordance with some embodiments of the present disclosure.

As illustrated in FIG. 3h, the host device 101 may send a data read instruction 302 for the configuration space 119 to the host PHY 115 through the DIMM interface 109. The command detector 201 of the adaptive latency module 117 may receive the data read instruction 302 from the host PHY 115, and may send a configuration space trigger signal 317 to a second latency handler 215 of the adaptive latency module 117. Upon receiving the configuration space trigger signal 317, the second latency handler 215 may retrieve the synchronized read latency value of 20 ns from the latency register 211, and configuration space data 319. In addition, a second counter 217 in the second latency handler 215 may initiate counting upon receiving the configuration space trigger signal 317. Here, the second counter 217 may stop counting upon expiry of the 20 ns time duration. When the second counter 217 is stopped, the second latency handler 215 may send latency introduced configuration space data 321 to the host PHY 115. Further, the host PHY 115 may send the data to the host device 101 through the DIMM interface 109. In this manner, the second latency handler 215 may introduce a path delay in the second type data path 133 for achieving the synchronization. This ensures that the read latency associated with the second type data path 133 is deterministic and equal to the read latencies associated with the first type data paths 131 in the NMP-DIMM system 111.

Figure 3C:
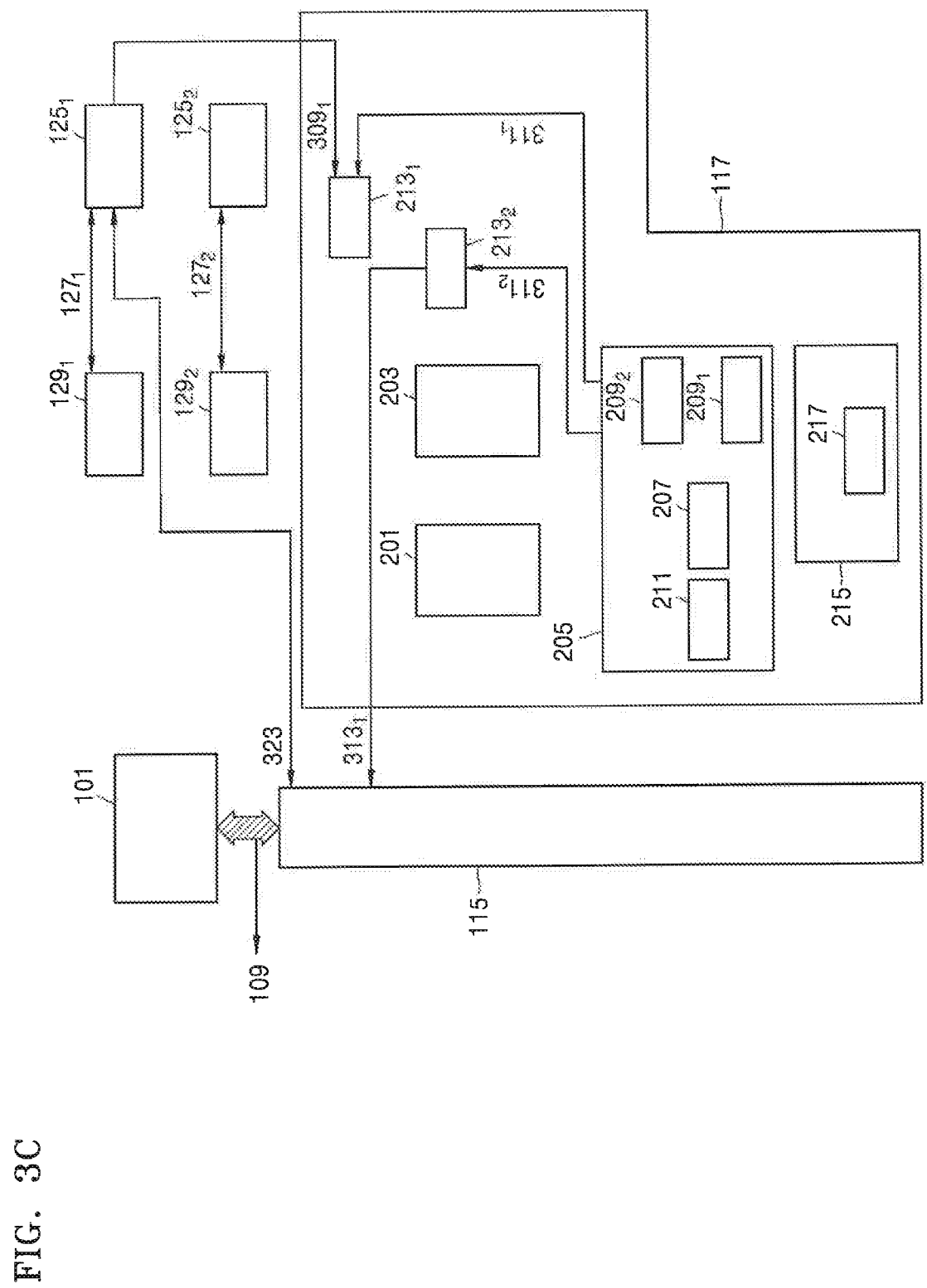
FIG. 3c shows an example scenario illustrating interactions of NMP-DIMM system components with a host device for performing a data read operation on a first memory unit post synchronization in accordance with some embodiments of the present disclosure.

FIG. 3c shows an example scenario illustrating interactions of NMP-DIMM system components with a host device for performing a data read operation on a first memory unit post synchronization in accordance with some embodiments of the present disclosure.

As illustrated in FIG. 3c, upon completion of the synchronization, the host device 101 may send a data read instruction 323 for the first memory unit $129_1$ to the host PHY 115 through the DIMM interface 109. The first memory PHY $125_1$ may receive the data read instruction 323 from the host PHY 115, and may send the data read instruction 323 to the first memory unit $129_1$. In response to the data read instruction 323, the first memory PHY $125_1$ may receive the data read from the first memory unit $129_1$ through the first memory interface $127_1$ and may send the data $309_1$ to the respective first latency handler $213_1$. As the actual read latency value associated with the first memory unit $129_1$ is determined as 15 us during the training, the first latency handler $213_1$ may introduce a path delay of 5 ns in the first type data path associated with the first memory unit $129_1$. Here, the path delay of 5 ns may be determined based on the calculated offset value obtained during the training. In this manner, the first latency handler $213_1$ may delay sending the data to the host PHY 115 to exhibit a latency of 20 ns to the host device 101.

FIGS. 4a-413 show example timing diagrams illustrating MPR training by a host device in accordance with some embodiments of the present disclosure.

FIG. 4a shows an example timing diagram corresponding to an MPR based dummy read operation. In this example, the MPR training by the host device 400 may span from a time instant $T_0$ to a time instant $T_{10}$. As illustrated in FIG. 4a, an MPR enable command 403 may be sent to the NMP-DIMM system 111 through the DIMM interface 109 at the time instant $T_0$. Further, the MPR enable command 403 may be sent to the first memory interface $127_1$ and the second memory interface $127_2$ at a time instant $T_1$ for initiating the dummy read operation. Further, an MPR read command 405 corresponding to the MPR read instruction may be sent to the NMP-DIMM system 111 through the DIMM interface 109 at a time instant $T_2$. The MPR read command 405 may be sent to the first memory unit $129_1$ and the second memory unit $129_2$ through the first memory interface $127_1$ and the second memory interface $127_2$, respectively at a time instant $T_2$. In response to the received MPR read command 405 at the first memory unit $129_1$, static data stored in a MODE register of the first memory unit 129 may be retrieved. The first memory unit $129_1$ may send the MPR read data 407 to the first memory $125_1$ through the first memory interface $127_1$ at a time instant $T_5$. In addition, static data stored in a MODE register of the second memory unit 129 may be retrieved, in response to the received MPR read command 405 at the second memory unit $129_2$. Further, the second memory unit $129_2$ may send the MPR read data 407 to the second memory PHY $125_2$ through the second memory interface $127_2$ at a time instant $T_6$ Thereafter, the latency detector 205 may generate the read enable signal 315 at a time instant $T_7$ for sending the MPR read data 407, retrieved from the first memory unit $129_1$ and the second memory unit $129_2$ to the host PHY 115. Upon receipt of the data through the DIMM interface 109, the host device 101 may send an MPR disable command 409 to the NMP-DIMM system 111 through the DIMM interface 109 at a time instant $T_9$. Further, the MPR disable command 409 may be sent to the first memory interface $127_1$ and the second memory interface $127_2$ at the time instant $T_{10}$ for terminating the dummy read operation.

Figure 4B:
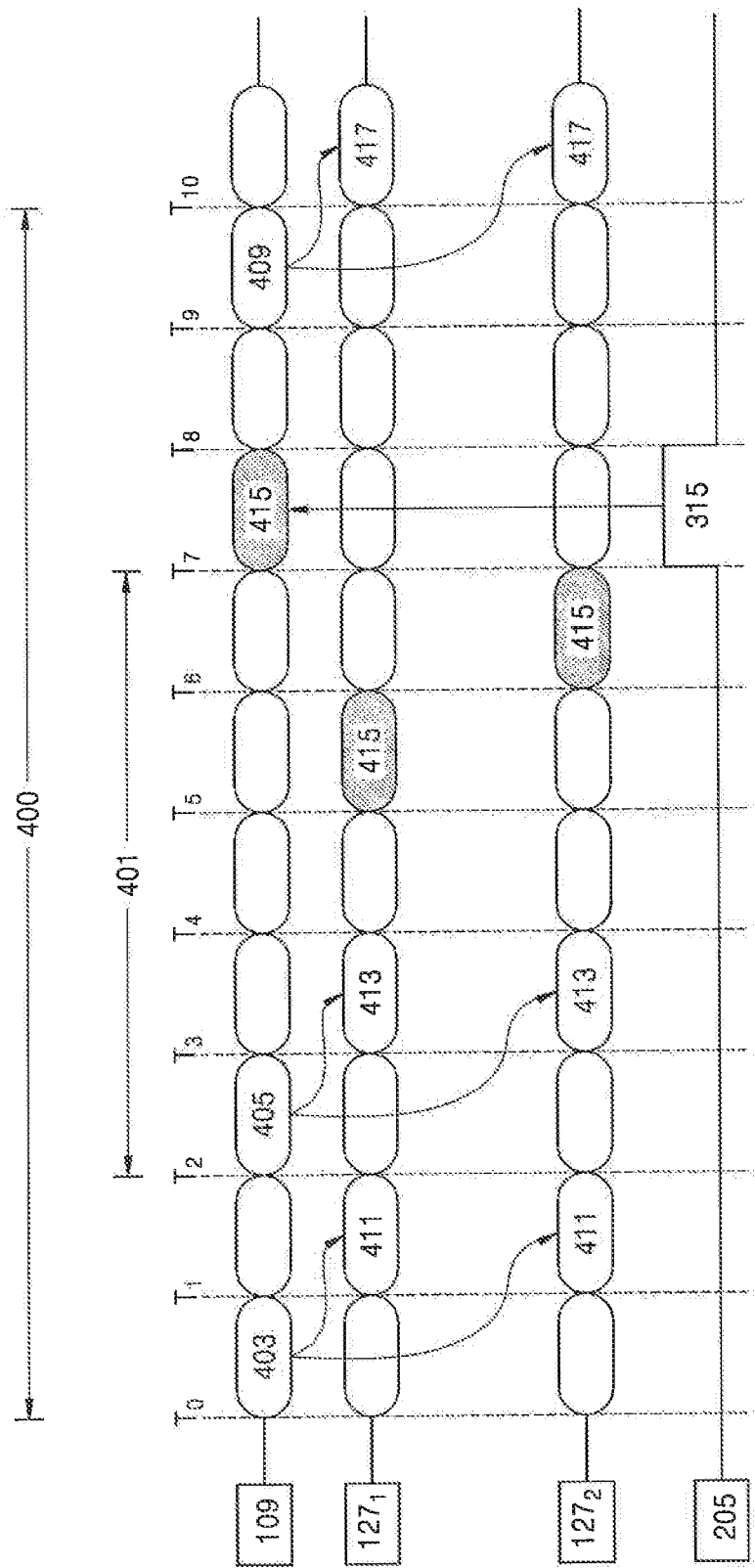

FIG. 4b shows an example timing diagram corresponding to a DRAM based dummy read operation. In this example, upon receiving the MPR enable command 403 through the DIMM interface 109 at a time instant $T_0$, an Activate (ACT) command 411 may be sent to each of the first memory interface $127_1$ and the second memory interface $127_2$ at a time instant $T_1$ for activating appropriate rows of the first memory unit $129_1$ and the second memory unit $129_2$ to read the contents of the rows into a row buffer. Further, an MPR read command 405 corresponding to the MPR read instruction may be sent to the NMP-DIMM system 111 through the DIMM interface 109 at a time instant $T_2$. Upon receiving the MPR read command 405, a Read (RD) command 413 may be sent to the activated rows of the first memory unit $129_1$ and the second memory unit $129_2$ at a time instant $T_3$. In response to the received RD command 413, data 415 may be read from the activated rows of the first memory unit 129 and the second memory unit $129_2$ at time instants $T_5$ and $T_6$, respectively. Further, the read data 415 may be sent to the host PHY 115 at a time instant $T_7$, when the read enable signal 315 is HIGH. Further, an MPR disable command 409 may be sent to the NMP-DIMM system 111 through the DIMM interface 109 at a time instant $T_9$. A Precharge (PRE) command 417 may be sent to each of the first memory interface $127_1$ and the second memory interface $127_2$ at a time instant $T_{10}$.

In the examples illustrated in FIGS. 4a-4b, time instants $T_5$ and $T_6$ associated with the data retrieval corresponding to the MPR training are different, which gives rise to different read latency values observed by the host device 101 for different first type data paths 131. This inequality in read latency values may be avoided due to the synchronization. In addition, the synchronization may ensure that the read enable signal 315 is generated only after receiving the data from both of the first and second memory units $129_1$, $129_2$. In this manner, the read latency 401 seen at the host device 101 for different first type data paths 131 may be of equal time duration, instead of different read latencies associated with respective first type data paths 131. It will be understood that the aforesaid examples and values thereof in this specification are for purposes of illustration only, and are not to be construed in a limiting sense.

Figure 5:
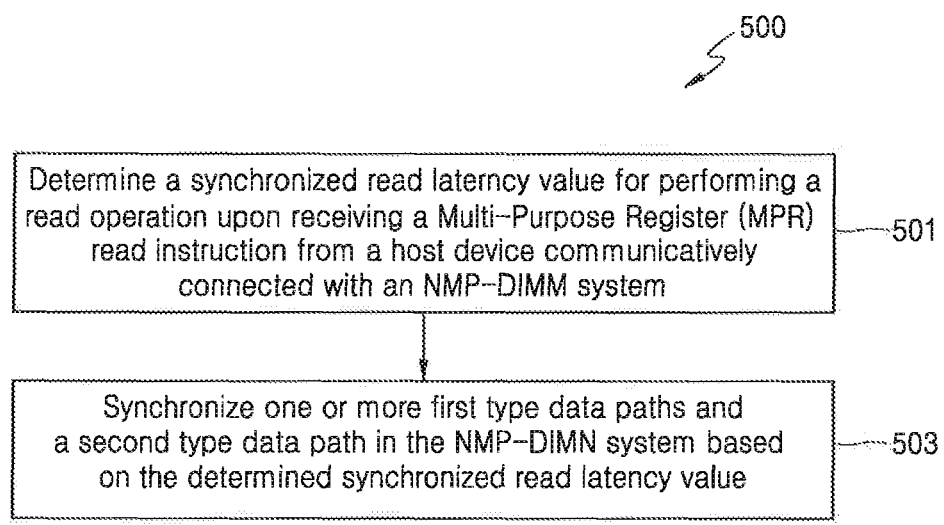
FIGS. 5-6 show flowcharts illustrating methods of operating an NMP-DIMM system for performing a read operation in accordance with some embodiments of the present disclosure.

FIG. 5 illustrates a flowchart showing a method of operating an NMP-DIMM system for performing a read operation in accordance with some embodiments of the present disclosure.

As illustrated in FIG. 5, the method 500 includes one or more blocks for operating the NMP-DIMM system 111 for performing the read operation in accordance with some embodiments of the present disclosure. The method 500 may be described in the context of computer executable instructions. For example, computer executable instructions can include routines, programs, objects, components, data structures, procedures, units, and functions, which perform particular functions or implement particular abstract data types.

The order in which the method 500 is described is not intended to be construed as a limitation, and any number of the described method blocks can be combined in any order to implement the method. Additionally, individual blocks may be deleted from the methods described herein. Furthermore, the method can be implemented in any suitable hardware, software, firmware, or combination thereof.

At block 501, the method may include determining, by an adaptive latency module 117 of the NMP-DIMM system 111, a synchronized read latency value for performing the read operation. The synchronized read latency value may be determined upon receiving a Multi-Purpose Register (MPR) read instruction from a host device 101 communicatively connected with the NMP-DIMM system 111. The MPR read instruction may be received from the host device 101 for training the NMP-DIMM system 111. Here, the synchronized read latency value may be determined based on one or more read latency values associated with one or more memory units 129 of the NMP-Dill system 111.

Particularly, a dummy read operation may be executed on the one or more memory units 129 through respective one or more memory PHYs 125 upon receiving the MPR read instruction from the host device 101. To execute the dummy read operation, a dummy read instruction 305 may be sent to each of the one or more memory PHYs 125 associated with the one or more memory units 129 upon receiving the MPR read instruction. The dummy read instruction 305 may be one of an MPR read command and a DRAM read command. In response to the dummy read instruction 305, dummy read data 307 may be received from each of the one or more memory units 129 through the respective one or more memory PHYs 125.

Upon executing the dummy read operation, the one or more read latency values associated with the one or more memory units 129 may be measured based on the executed dummy read operation. To measure the one or more read latency values, a dummy read trigger signal may be generated upon sending the dummy read instruction 305 to each of the one or more memory PHYs 125. The dummy read trigger signal may be generated for triggering a first counter 207 of the adaptive latency module 117. Further, one or more time-durations associated with receiving the dummy read data 307 from each of the one or more memory units 129 may be determined by the triggered first counter 207. Based on the determined one or more time-durations, the one or more read latency values associated with the one or more memory units 129 may be measured by the triggered first counter 207. Thereafter, the measured one or more read latency values may be stored in one or more registers 209 of the adaptive latency module 117. In addition, a maximum read latency value among the measured one or more read latency values may be determined as the synchronized read latency value, upon measuring the one or more read latency values.

At block 503, the method may include synchronizing, by the adaptive latency module 117, one or more first type data paths 131 and a second type data path 133 in the NMP-DIMM system 111 based on the determined synchronized read latency value. The one or more first type data paths 131 may be associated with extracting data from the one or more memory units 129 of the NMP-DIMM system 111. Here, each of the one or more memory units 129 may be a DRAM. Further, the second type data path 133 may be associated with extracting data from a configuration space 119 of the NMP-DIMM system 111. The configuration space 119 may configure an accelerator of the NMP-DIMM system III, and may store results and status of the accelerator.

To synchronize the one or more first type data paths 131 in the NMP-DIMM system 111, an offset value may be determined for each of the one or more first type data paths 131. The offset value may be determined based on a difference between the synchronized read latency value and a respective read latency value. Based on the determined offset value, a path delay may be introduced in each of the one or more first type data paths 131. Further, data read from each of the one or more memory units 129 may be sent to the host device 101 based on the respective introduced path delay.

Further, to synchronize the second type data paths 133 in the NMP-DIMM system 111, a second counter 217 associated with the second type data path 133 may be triggered.

The second counter 217 of the adaptive latency module 117 may be triggered upon receiving a data read instruction 302 from the host device 101. The second counter 217 may be stopped upon expiry of a time duration equal to the synchronized read latency value. Thereafter, data read from the configuration space 119 may be sent to the host device 101 when the second counter 217 is stopped.

Figure 6:
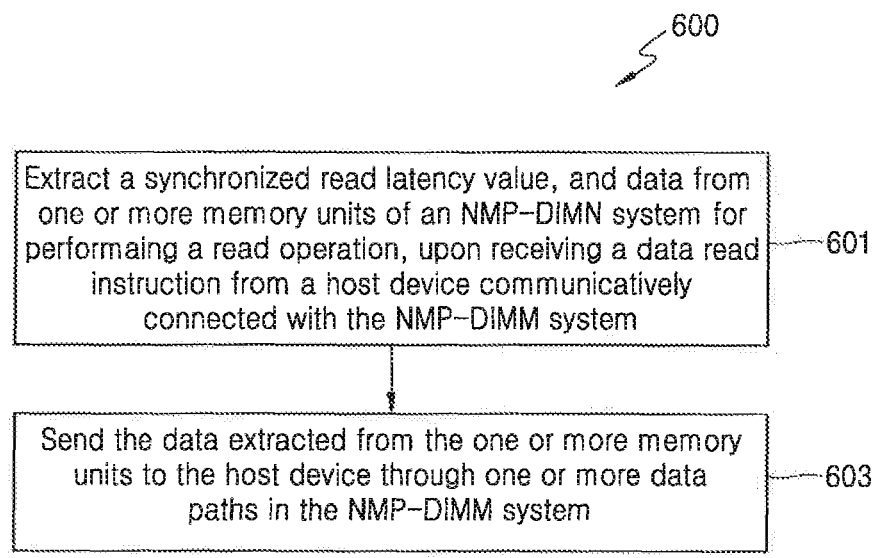

FIG. 6 illustrates another flowchart showing a method of operating an NMP-DIMM system for performing a normal read operation in accordance with some embodiments of the present disclosure.

As illustrated in FIG. 6, the method 600 includes one or more blocks for operating the NMP-DIMM system 111 for performing the normal read operation in accordance with some embodiments of the present disclosure. The method 600 may be described in the context of computer executable instructions. For example, computer executable instructions can include routines, programs, objects, components, data structures, procedures, units, and functions, which perform particular functions or implement particular abstract data types.

The order in which the method 600 is described is not intended to be construed as a limitation, and any number of the described method blocks can be combined in any order to implement the method. Additionally, individual blocks may be deleted from the methods described herein. Furthermore, the method can be implemented in any suitable hardware, software, firmware, or combination thereof.

At block 601, the method may include extracting, by the NMP-DIMM system 111, a synchronized read latency value, and data from one or more memory units 129 of the NMP-DIMM system 111 for performing the read operation. The synchronized read latency value and the data may be extracted upon receiving a data read instruction from a host device 101 communicatively connected with the NMP-DIMM system 111.

At block 603, the method may include sending, by the NMP-DIMM system 111, the data extracted from the one or more memory units 129 to the host device 101 through one or more data paths in the NMP-DIMM system 111. The one or more data paths may be synchronized based on the extracted synchronized read latency value. Here, the one or more data paths may be associated with extracting data from the one or more memory units 129 of the NMP-DIMM system 111. Each of the one or more memory units 129 may be a DRAM. Particularly, a path delay may be introduced in each of the one or more data paths based on a respective offset value. The offset value for each of the one or more data paths may be determined based on a difference between the synchronized read latency value and a read latency value associated with each of the one or more memory units 129. Further, based on the respective introduced path delay, data read from each of the one or more memory units 129 may be sent to the host device 101.

In an embodiment, the present disclosure provides a method, an adaptive latency module and an NMP-DIMM system for performing a read operation.

In an embodiment, the present disclosure enables extracting read latencies associated with memory units of the NMP-DIMM system prior to performing a read operation.

In an embodiment, the present disclosure adaptively determines a read latency value based on the individual read latencies of memory unit data paths of the NMP-DIMM system.

In an embodiment, the present disclosure synchronizes the memory unit data paths and a configuration space data path based on the determined read latency value to exhibit equal read latencies to a host device, thereby preventing data loss during the read operation. Further, all of the read latencies of the memory unit data paths and the configuration space data path are adapted to a single value without the need for a memory or command modification.

In an embodiment, the present disclosure enables the host device to access the memory unit data paths and the configuration space data path in a deterministic manner.

In an embodiment, the present disclosure reduces data loss during a read operation and ensures that data integrity is maintained due to the synchronization.

The operations described herein may be implemented as a method, system or article of manufacture using standard programming and/or engineering techniques to produce software, firmware, hardware, or any combination thereof. The described operations may be implemented as code maintained in a "non-transitory computer readable medium", where a processor may read and execute the code from the computer readable medium. The processor is at least one of a microprocessor and a processor capable of processing and executing the queries. A non-transitory computer readable medium may include media such as a magnetic storage medium (e.g., hard disk drives, floppy drives, tape, etc.), optical storage (CD-ROMs, DVDs, optical disks, etc.), volatile and non-volatile memory devices (e.g., Electrically Erasable and Programmable Read Only Memories (EEPROMs), ROMs, PROMs, Random Access Memories (RAMs), Dynamic RAMs (DRAMs), Static RAMs (SRAMs), Flash Memory, firmware, programmable logic, etc.), etc. Further, non-transitory computer-readable media may include all computer-readable media except for transitory computer-readable media. The code implementing the described operations may further be implemented in hardware logic (e.g., an integrated circuit chip, a Programmable Gate Array (PGA), an Application Specific Integrated Circuit (ASIC), etc.).

The terms "an embodiment", "embodiment", "embodiments", "the embodiment", "the embodiments", "one or more embodiments", "some embodiments", and "one embodiment" may mean "one or more (but not all) embodiments of the present disclosure(s)" unless expressly specified otherwise.

The terms "including", "comprising", "having" and variations thereof may mean "including but not limited to", unless expressly specified otherwise.

The enumerated listing of items does not imply that any or all of the items are mutually exclusive, unless expressly specified otherwise.

The terms "a", "an" and "the" may mean "one or more", unless expressly specified otherwise.

A description of an embodiment with several components in communication with each other does not imply that all such components are required. For example, a variety of optional components are described to illustrate the wide variety of possible embodiments of the present disclosure.

When a single device or article is described herein, it will be readily apparent that more than one device/article (whether or not they cooperate) may be used in place of the single device/article. Similarly, where more than one device or article is described herein (whether or not they cooperate), it will be readily apparent that a single device/article may be used in place of the more than one device or article or a different number of devices/articles may be used instead of the shown number of devices or articles. The functionality and/or the features of a device may be alternatively embodied by one or more other devices which are not explicitly described as having such functionality/features. Thus, other embodiments of the present disclosure need not include the device itself.

The illustrated operations of figures show certain events occurring in a certain order. In alternative embodiments of the present disclosure, certain operations may be performed in a different order, modified or removed. Moreover, steps may be added to the above-described logic and still conform to the described embodiments. Further, operations described herein may occur sequentially or certain operations may be processed in parallel. Yet further, operations may be performed by a single processing unit or by distributed processing units.

We claim:

1. A method of operating a Near Memory Processing-Dual In-line Memory (NMP-DIMM) system, the method comprising:
   determining, by an adaptive latency module of the NMP-DIMM system, a synchronized read latency value for performing a read operation upon receiving a Multi-Purpose Register (MPR) read instruction from a host device communicatively connected with the NMP-DIMM system, wherein the MPR read instruction is received from the host device for training the NMP-DIMM system, wherein the synchronized read latency value is determined based on one or more read latency values associated with one or more memory units of the NMP-DIMM system; and
   synchronizing, by the adaptive latency module, one or more first type data paths with a second type data path in the NMP-DIMM system based on the determined synchronized read latency value,
   wherein the one or more first type data paths are associated with extracting data from the one or more memory units of the NMP-DIMM system, each of the one or more memory units is a Dynamic Random-Access Memory (DRAM), and
   wherein the second type data path is associated with extracting data from a configuration space of the NMP-DIMM system, wherein the configuration space configures an accelerator of the NMP-DIMM system, and stores results and status of the accelerator.

2. The method as claimed in claim 1, wherein determining the synchronized latency value comprises:
   executing, by the adaptive latency module, a dummy read operation on the one or more memory units through respective one or more memory physical layers (PHYs) upon receiving the MPR read instruction;
   measuring, by the adaptive latency module, the one or more read latency values associated with the one or more memory units based on the executed dummy read operation; and
   determining, by the adaptive latency module, a maximum read latency value among the measured one or more read latency values as the synchronized read latency value.

3. The method as claimed in claim 2, wherein executing the dummy read operation on the one or more memory units comprises:
   sending, by the adaptive latency module, a dummy read instruction to each of the one or more memory PHYs associated with the one or more memory units upon receiving the MPR read instruction from the host device, wherein the dummy read instruction is an MPR read command or a Dynamic Random-Access Memory (DRAM) read command; and receiving, by the adaptive latency module, dummy read data from each of the one or more memory units through the respective one or more memory PHYs in response to the dummy read instruction.

4. The method as claimed in claim 2, wherein measuring the one or more read latency values associated with the one or more memory units comprises:

generating, by the adaptive latency module, a dummy read trigger signal for triggering a first counter upon sending the dummy read instruction to each of the one or more memory PHYS;

determining, by the triggered first counter, one or more time-durations associated with receiving the dummy read data from each of the one or more memory units;

measuring, by the triggered first counter, the one or more read latency values associated with the one or more memory units based on the determined one or more time-durations; and storing, by the adaptive latency module, the measured one or more read latency values in one or more registers.

5. The method as claimed in claim 1, wherein synchronizing the one or more first type of data paths in the NMP-DIMM system based on the determined synchronized read latency value comprises:

determining, by the adaptive latency module, an offset value for each of the one or more first type data paths based on a difference between the synchronized read latency value and a respective read latency value;

introducing, by the adaptive latency module, a path delay in each of the one or more first type data paths based on the determined offset value; and sending, by the adaptive latency module, data read from each of the one or more memory units to the host device based on the respective introduced path delay.

6. The method as claimed in claim 1, wherein synchronizing the second type data path in the NMP-DIMM system based on the determined synchronized read latency value comprises:

triggering, by the adaptive latency module, a second counter associated with the second type data path upon receiving a data read instruction from the host device, wherein the second counter is stopped upon expiry of a time duration equal to the synchronized read latency value; and sending, by the adaptive latency module, data read from a configuration space to the host device when the second counter is stopped.

7. An adaptive latency module configured in a Near Memory Processing-Dual In-line Memory (NMP-DIMM) system, the adaptive latency module comprising:

a command detector configured to:

detect a Multi-Purpose Register (MPR) read instruction from a host device communicatively connected with the NMP-DIMM system, wherein the MPR read instruction is received from the host device for training the NMP-DIMM system;

a latency detector communicatively connected with the command detector, wherein the latency detector is configured to:

determine a synchronized read latency value for performing the read operation upon receiving the MPR read instruction, wherein the synchronized read latency value is determined based on one or more read latency values associated with one or more memory units of the NMP-DIMM system;

one or more first latency handlers communicatively connected with the latency detector and the one or more memory units, wherein the one or more first latency handlers are configured to:

synchronize one or more first type data paths in the NMP-DIMM system based on the determined synchronized read latency value; and a second latency handler communicatively connected with the latency detector and a configuration space of the NMP-DIMM system, wherein the second latency handler is configured to:

synchronize a second type data path in the NMP-DIMM system based on the determined synchronized read latency value, such that the second type data path is synchronized with the one or more first type data paths, wherein the one or more first type data paths are associated with extracting data from the one or more memory units, wherein each of the one or more memory units is a Dynamic Random-Access Memory (DRAM), and wherein the second type data path is associated with extracting data from the configuration space, wherein the configuration space configures an accelerator of the NMP-DIMM system, and stores results and status of the accelerator.

8. The adaptive latency module as claimed in claim 7, further comprising a dummy read initiator configured to:

receive an MPR training signal from the command detector, wherein the MPR training signal is generated by the command detector upon receiving the MPR read instruction from the host device;

send a dummy read instruction to each of the one or more memory PHYs associated with the one or more memory units upon receiving the MPR training signal from the command detector for executing a dummy read operation on the one or more memory units, wherein the dummy read instruction is an MPR read command or a Dynamic Random-Access Memory (DRAM) read command; and generate a dummy read trigger signal for triggering a first counter in the latency detector upon sending the dummy read instruction to each of the one or more memory PHYS.

9. The adaptive latency module as claimed in claim 8, wherein the latency detector is configured to:

receive dummy read data from each of the one or more memory units through the respective one or more memory PHYs in response to the dummy read instruction;

measure the one or more read latency values associated with the one or more memory units upon receiving the dummy read data; and determine a maximum read latency value among the measured one or more read latency values as the synchronized read latency value.

10. The adaptive latency module as claimed in claim 8, wherein the latency detector is configured to:

determine, by the triggered first counter, one or more time-durations associated with receiving the dummy read data from each of the one or more memory units;

measure, by the triggered first counter, the one or more read latency values associated with the one or more memory units based on the determined one or more time-durations; and store the measured one or more read latency values in one or more registers.

11. The adaptive latency module as claimed in claim 7, wherein each of the one or more first latency handlers is configured to:

determine an offset value for a respective first type data path among the one or more first type data paths based on a difference between the synchronized read latency value and a respective read latency value among the one or more read latency values;

introduce a path delay in the respective first type data path among the one or more first type data paths based on the determined offset value; and send data read from respective memory units among the one or more memory units to the host device based on the introduced path delay.

12. The adaptive latency module as claimed in claim 7, wherein the command detector is configured to:

trigger a second counter in the second latency handler associated with the second type data path upon receiving a data read instruction from the host device, wherein the second counter is stopped upon expiry of a time duration equal to the synchronized read latency value; and wherein the second latency handler is configured to:

send data read from the configuration space to the host device when the second counter is stopped.

13. A method of operating a Near Memory Processing-Dual In-line Memory (NMP-DIMM) system, the method comprising:

extracting, by the NMP-DIMM system, a synchronized read latency value, and data from one or more memory units of the NMP-DIMM system, and performing, by the NMP-DIMM system, a read operation, upon receiving a data read instruction from a host device communicatively connected with the NMP-DIMM system;

sending, by the NMP-DIMM system, the data extracted from the one or more memory units to the host device through one or more data paths in the NMP-DIMM system, wherein the one or more data paths are synchronized based on the extracted synchronized read latency value; and synchronize a second type data path in the NMP-DIMM system based on the extracted synchronized read latency value, such that the second type data path is synchronized with the one or more first type data paths, wherein the one or more data paths are associated with extracting data from the one or more memory units of the NMP-DIMM system, each of the one or more memory units is a Dynamic Random-Access Memory (DRAM), and wherein the second data path is associated with extracting data from a configuration space of the NMP-DIMM system, wherein the configuration space configures an accelerator of the NMP-DIMM system, and stores results and status of the accelerator.

14. The method as claimed in claim 13, wherein sending the data extracted from the one or more memory units to the host device comprises:

introducing, by the NMP-DIMM system, a path delay in each of the one or more data paths based on a respective offset value, wherein the offset value for each of the one or more data paths is determined based on a difference between the synchronized read latency value and a read latency value associated with each of the one or more memory units; and sending, by the NMP-DIMM system, data read from each of the one or more memory units to the host device based on the respective introduced path delay.

* * * * *